United States Patent
Backes

(10) Patent No.: US 10,234,588 B2
(45) Date of Patent: Mar. 19, 2019

(54) MAGNETIC PROXIMITY SENSOR

(71) Applicant: TRW AUTOMOTIVE ELECTRONICS & COMPONENTS GMBH, Radolfzell (DE)

(72) Inventor: Ulrich Backes, Radolfzell (DE)

(73) Assignee: TRW AUTOMOTIVE ELECTRONICS & COMPONENTS GmbH (DE)

( * ) Notice: Subject to any disclaimer, the term of this patent is extended or adjusted under 35 U.S.C. 154(b) by 0 days.

(21) Appl. No.: 14/776,753

(22) PCT Filed: Mar. 31, 2014

(86) PCT No.: PCT/EP2014/056485
§ 371 (c)(1),
(2) Date: Sep. 15, 2015

(87) PCT Pub. No.: WO2014/170124
PCT Pub. Date: Oct. 23, 2014

(65) Prior Publication Data
US 2016/0041288 A1     Feb. 11, 2016

(30) Foreign Application Priority Data

Apr. 19, 2013 (DE) .......... 10 2013 104 001

(51) Int. Cl.
*H01H 39/00* (2006.01)
*G01V 3/08* (2006.01)
*H03K 17/95* (2006.01)
*H01H 36/00* (2006.01)

(52) U.S. Cl.
CPC .......... *G01V 3/08* (2013.01); *H01H 36/0006* (2013.01); *H03K 17/9505* (2013.01); *H03K 17/9517* (2013.01); *H03K 2217/952* (2013.01)

(58) Field of Classification Search
CPC .......... H03K 17/9505; H03K 17/9517; H03K 2217/952; H01H 36/0006; G01V 3/08
USPC .................................................. 335/205–207
See application file for complete search history.

(56) References Cited

U.S. PATENT DOCUMENTS

| | | | | |
|---|---|---|---|---|
| 4,295,118 A * | 10/1981 | Herr | .................... | H03K 17/9517 323/294 |
| 5,093,617 A * | 3/1992 | Murata | ..................... | F02P 7/07 123/146.5 A |
| 5,128,641 A * | 7/1992 | Posey | ................... | H01H 36/002 335/151 |
| 5,554,964 A | 9/1996 | Jansseune | | |

(Continued)

FOREIGN PATENT DOCUMENTS

| | | |
|---|---|---|
| CN | 2099376 | 3/1992 |
| DE | 4211486 | 4/1993 |

(Continued)

*Primary Examiner* — Bernard Rojas
(74) *Attorney, Agent, or Firm* — Tarolli, Sundheim, Covell & Tummino LLP

(57) ABSTRACT

A proximity sensor (12) is provided which comprises a magnet (16) and a sensor (18). The sensor (18) is aligned relative to the magnet (16) in such a manner that the direction (E) of maximum sensitivity of the sensor (18) is formed so as to be substantially parallel to the magnet axis (M) extending through the poles (20, 22) of the magnet (16). Further, an assembly unit (10) is provided.

20 Claims, 4 Drawing Sheets

(56) References Cited

U.S. PATENT DOCUMENTS

| | | | | |
|---|---|---|---|---|
| 6,060,969 | A * | 5/2000 | Hufgard | H03K 17/97 324/207.21 |
| 6,900,713 | B2 * | 5/2005 | Kasashima | H03K 17/97 335/205 |
| 7,199,688 | B2 * | 4/2007 | Edmonson, Jr. | H01H 36/0013 335/151 |
| 2008/0048809 | A1 | 2/2008 | Narita et al. | |

FOREIGN PATENT DOCUMENTS

| | | |
|---|---|---|
| DE | 4333395 | 4/1995 |
| DE | 4427220 | 2/1996 |
| DE | 9219096 | 11/1997 |
| DE | 19902256 | 7/2000 |
| DE | 10303363 | 8/2004 |
| DE | 10355003 | 6/2005 |
| DE | 102007031924 | 2/2008 |
| DE | 102007030705 | 2/2009 |
| DE | 102010040816 | 7/2011 |
| DE | 102010039804 | 3/2012 |
| EP | 0578261 | 1/1994 |
| EP | 1310771 | 11/2001 |
| EP | 1292029 | 8/2002 |
| EP | 0903856 | 6/2006 |
| EP | 2728302 | 5/2014 |
| GB | 2073428 | 10/1981 |
| JP | 2004200046 | 7/2004 |
| WO | 2013002135 | 1/2013 |

\* cited by examiner

MAGNETIC PROXIMITY SENSOR

RELATED APPLICATIONS

This application corresponds to PCT/EP2014/056485, filed Mar. 31, 2014, which claims the benefit of German Application No. 10 2013 104 001.2, filed Apr. 19, 2013, the subject matter, of which are incorporated herein by reference in their entirety.

BACKGROUND OF THE INVENTION

The invention relates to a proximity sensor comprising a magnet and a sensor as well as to an assembly unit comprising a proximity sensor of this type.

Proximity sensors are used in many fields of technology and are known from the prior art in most varied embodiments. Proximity sensors are implemented as an access monitoring means for machines, as vehicular hood switches or vehicle door contact switches, for example. Here, the task of a proximity sensor is to detect the approach of a part to be monitored to the sensor and to trigger a corresponding signal. The designs of the proximity sensors differ depending on the field of application. They may be realized with an electric contact, an inductive sensor or a magnet, which is fastened to the part to be monitored. These known solutions, however, have disadvantages with respect to the functional principle which may be restricted due to the electromagnetic compatibility, or because of the assembly effort. The design comprising an electric contact is prone to wear, for instance, whereas the embodiment comprising a magnet which is fastened to the part to be monitored involves a high assembly effort, because the magnet has to be attached to the part to be monitored. Moreover, an open magnetic field on the part to be monitored is undesired in many fields of application.

SUMMARY OF THE INVENTION

Therefore, it is the object of the invention to provide a proximity sensor which is highly versatile and requires a low assembly effort.

In order to achieve this object, a proximity sensor comprising a magnet and a sensor is provided, the sensor being aligned relative to the magnet in such a manner that the direction of maximum sensitivity of the sensor is formed so as to be substantially parallel to the magnet axis extending through the poles of the magnet. Thus, the direction of maximum sensitivity of the sensor is consistent with the laterally extending field lines of the magnet. This means that the sensor is situated between the two poles of the magnet and is arranged in the area where the magnetic flux is weaker. In this arrangement, the sensor identifies a change in the magnetic field or magnetic flux density due to an approaching element to be monitored, which consists of a ferromagnetic material, such as a hood, a vehicle door or a machine element. When the element to be monitored comes closer, the magnetic flux lines are deflected away from the sensor and into the element to be monitored, a magnetic short-circuit occurring in this process so that the magnetic flux density decreases in the area of the sensor. Here, the sensor and the magnet of the proximity sensor are arranged so as to be stationary with respect to the part to be monitored, so that the assembly effort is low. Further, the proximity sensor is free from wear, as contacting means are not necessary.

In particular, provision is made that the magnet is a permanent magnet. This ensures the presence of an enduring magnetic field whose magnetic flux is constant. The permanent magnet may be implemented as a rod magnet. Due to its geometry comprising opposite and spaced poles, such a magnet has a magnetic field which is formed such that the sensor can be arranged with its direction of maximum sensitivity being parallel to the magnet axis or in the area of the lower magnetic flux density.

According to an aspect of the invention, the sensor is a magnetic field sensor which is capable of detecting the magnetic flux density of the magnet or to identify a change in the magnetic flux density. The sensor of the proximity sensor detects the magnetic field of the magnet of the proximity sensor, so that the magnet and the sensor form a self-contained sensor device.

According to an embodiment, provision is made that the sensor is a GMR sensor or a Hall sensor. These two sensor types are particularly suitable, as they are able to detect even small changes in the magnetic field or magnetic flux.

As an alternative, the sensor may also be a contact switch such as a Reed switch reacting to a magnetic field and switching due to the magnetic field.

According to an aspect of the invention, flux guiding elements are provided, which are arranged in particular on the sides of the sensor. The flux guiding elements serve to deflect the magnetic flux or to enhance it, the magnetic field lines leaving the flux guiding elements at right angles. Here, the flux guiding elements may be arranged such that they come into contact with the element to be monitored. This is especially helpful if a sufficient approach of the element, to be monitored, to the sensor itself is not possible due to the package geometry of the sensor, i.e. the sensor housing. When the element to be monitored is not near, the flux guiding elements cause a concentration of the magnetic flux density, whereas the magnetic flux density may collapse in the area of the sensor in the event of a contact between the flux guiding elements and the element to be monitored.

In particular, provision is made that the flux guiding elements rest against the magnet, preferably on the two poles of the magnet. This allows to achieve the transfer of magnetic holding forces from the magnet via the flux guiding elements to the element to be monitored. Upon contact between the element to be monitored and the flux guiding elements, the element to be monitored is retained on the flux guiding elements due to the magnetic force exerted by the magnet.

According to an aspect of the invention, the sensor is provided in an integrated circuit comprising a printed circuit board. This allows a direct evaluation of the data detected by the sensor, with the possibility to transmit the corresponding sensor data to a control unit. Alternatively, provision can be made in this embodiment that the magnet is implemented as a solenoid and powered by the circuit.

In particular, provision is made that the circuit forms a switch. Here, the change in the magnetic flux detected by the sensor defines the characteristics of the switch, a threshold value being provided, triggering a switching process of the proximity sensor implemented as a switch on exceeding or falling below said threshold value.

According to an embodiment, provision is made that the sensor is arranged on a first side of the printed circuit board and the magnet is arranged on a second side of the printed circuit board. Thus, the printed circuit board serves as a mounting for the sensor as well as for the magnet, these two elements of the proximity sensor being separated from each other by the printed circuit board. In this arrangement, the positioning of the proximity sensor is designed such that the sensor is directed toward the element to be monitored, the magnet being arranged on the opposite side of the printed circuit board.

In particular, the flux guiding elements are arranged on that side of the printed circuit board where the sensor is arranged. This means that the flux guiding elements are arranged on that side of the printed circuit board which is directed to the element to be monitored. This allows the flux guiding elements to come into contact with the element to be monitored, so that the magnetic flux density breaks down upon contact between the flux guiding elements and the element to be monitored, the collapse resulting in a reduction of the magnetic flux density which is detected by the sensor.

According to an embodiment, provision is made that the flux guiding elements extend through the printed circuit board. In this embodiment, the flux guiding elements may be arranged on the poles of the magnet, so that a proximity sensor is formed which is designed as a switch. In addition to that, said proximity sensor is capable of exerting a holding force on the element to be monitored, namely via the flux guiding elements resting against the poles of the magnet.

The invention further provides an assembly unit comprising a vehicular lid and a proximity sensor of the type mentioned above. This assembly unit allows to detect the closing or opening process of a vehicular lid due to the proximity sensor described above. Here, the vehicular lid is the element to be monitored, which is associated to the sensor and has an influence on the magnetic flux and the magnetic flux density of the magnet to such an extent that the changes in the magnetic flux or magnetic flux density can be clearly detected by the sensor.

BRIEF DESCRIPTION OF THE DRAWINGS

Further features and advantages of the invention will be apparent from the following description and the following drawings to which reference is made and in which.

DESCRIPTION

Figure 1:
FIG. 1 shows a schematic arrangement of an assembly unit of the invention according to a first embodiment.
Figure 1:
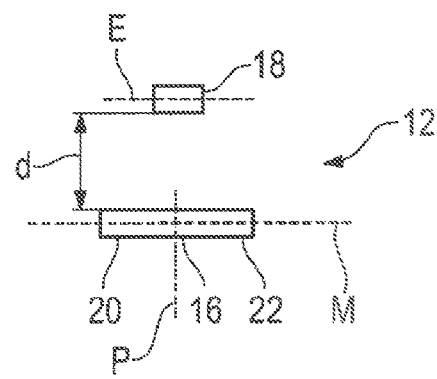

FIG. 1 schematically shows an assembly unit 10 according to the invention, consisting of a proximity sensor 12 and a vehicular lid 14, with the vehicular lid 14 representing the element which is to be monitored by the proximity sensor 12.

The proximity sensor 12 is substantially constituted by a magnet 16 and a sensor 18. Here, the proximity sensor 12 is arranged such that the sensor 18 is situated between the magnet 16 and the vehicular lid 14. The sensor 18 has a direction E of maximum sensitivity which is aligned so as to be substantially parallel to a magnet axis M of the magnet 16. The magnet axis M of the magnet 16 is the axis which extends through the two poles of the magnet 16, the magnetic north pole 20 and the magnetic south pole 22.

In this arrangement, the sensor 18 is positioned so as to be central with respect to the two poles 20, 22, the sensor 18 having a distance d to the magnet 16.

Figure 2:
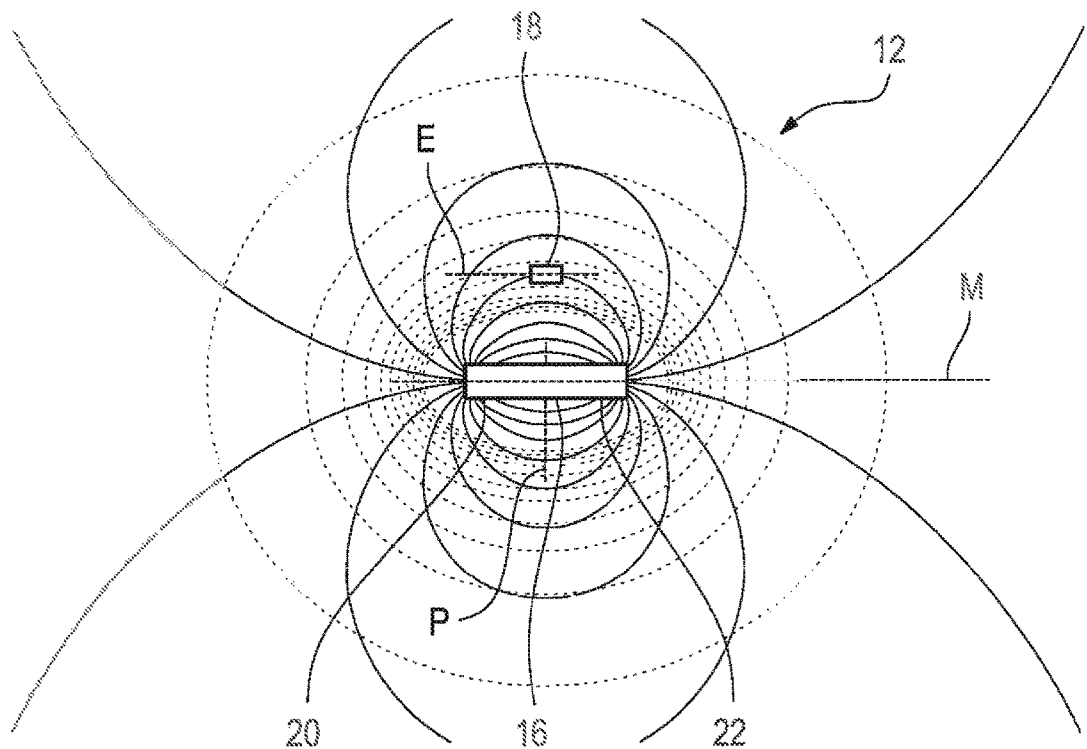
FIG. 2 shows the magnetic flux density of the assembly unit according to the first embodiment in a first state.

This distal distance d results in the sensor 18 being arranged in an area where the magnetic flux density of the magnet 16 is low. This is apparent in particular in FIG. 2 showing the assembly unit 10 of FIG. 1 in a first state, the vehicular lid 14 from FIG. 1 being not illustrated. Here, the first state describes the state in which the element to be monitored, here the vehicular lid 14, is not present in the area of the proximity sensor 12. This first state may also be referred to as the initial state.

On the other hand, a second state is defined in which the proximity of the element to be monitored, i.e. the vehicular lid 14, relative to the sensor 18 is identified. This second state may also be described as the switched or triggered state, but this depends on the field of application.

It can be taken from FIG. 2 that the sensor 18 has its direction E of maximum sensitivity E aligned such that the direction E of maximum sensitivity is substantially consistent with the laterally extending field lines of the magnet 16.

In the embodiment which is shown, the magnet 16 is implemented as a permanent magnet and in particular as a rod magnet, so that a magnetic field or a magnetic flux density will develop which are typical for a rod magnet, provided that the magnetic field is undisturbed. This magnetic field which is typical for a rod magnet is symmetric both with respect to the magnet axis M and a plane perpendicular to the magnet axis M, corresponding to the parting plane of the two poles 20, 22, the pole parting plane P.

Figure 3:
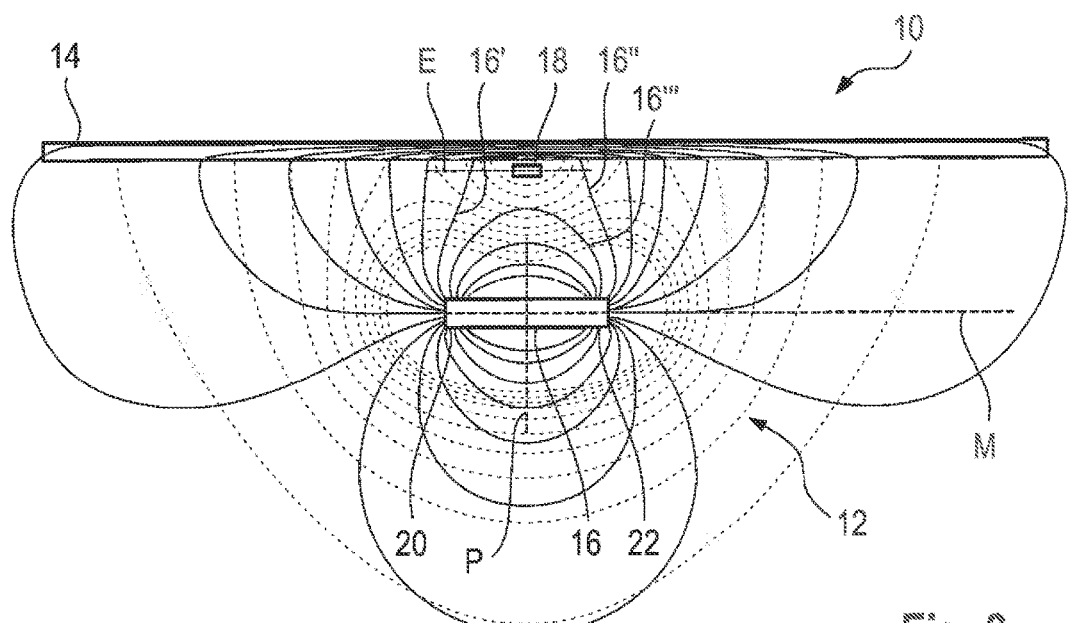
FIG. 3 shows the magnetic flux density of the assembly unit according to the first embodiment in a second state.

FIG. 3 shows the assembly unit 10 in the second state, in which the magnetic field and the magnetic flux density of the magnet 16 are changed or disturbed as compared to the initial state shown in FIG. 2, due to an approaching element to be monitored, here the vehicular lid 14.

As the vehicular lid 14 is made of a ferromagnetic material, the vehicular lid 14 has an influence on the magnetic field, so that the magnetic flux lines are deflected into the vehicular lid 14. Thus, the vehicular lid 14 disturbs or changes the magnetic field and the profile of the magnetic flux density of the magnet 16. This can be seen particularly well by the fact that the disturbed magnetic field is not symmetric to the magnet axis M any longer.

Depending on the position of the vehicular lid 14 relative to the proximity sensor 12 or the magnet 16, the magnetic field disturbed by the vehicular lid 14 may continue to be symmetric with respect to the pole parting plane P. This is the case in the embodiment shown in FIG. 3, for instance.

A comparison between FIGS. 2 and 3 demonstrates that the sensor 18 is positioned in the first state, the initial state, in the area of a specific magnetic field intensity or magnetic flux density, whereas in the second state the magnetic field or the magnetic flux density largely breaks down in the area of the sensor 18. This is due to the ferromagnetic vehicular lid 14 exerting an influence on the magnetic flux lines to such an extent that they extend into the vehicular lid 14 substantially at right angles.

The result is that a local minimum of the magnetic flux density is formed, being situated in the pole parting plane P and between the vehicular lid 14 and the sensor 18, directly in the area of the vehicular lid 14.

In the embodiment which is shown, the sensor 18 is arranged so as to be central with respect to the magnet 16, i.e. in the pole parting plane P, so that the sensor 18 in the second state is positioned in the local minimum of the magnetic flux density.

Here, the sensor 18 identifies a lower magnetic flux density or a change in the magnetic flux density, the reduction of or change in the magnetic flux density being crucially determined by the positioning of the sensor 18 relative to the vehicular lid 14. The closer the vehicular lid 14 can be moved toward the sensor 18, the larger is the change in the magnetic flux density in the area of the sensor 18. This effect is enhanced by the sensor 18 being arranged centrally between the two poles 20, 22 of the magnet 16, i.e. in the pole parting plane P, so that the major part of the magnetic field lines originating from the poles 20, 22 is deflected into the vehicular lid 14, said field lines closing only in the vehicular lid 14. This produces a magnetic short-circuit. The magnetic short-circuit results in a reduction of the flux density which is detected by the sensor 18.

This is shown particularly clear in FIG. 3. Said Figure shows two magnetic field lines 16', 16" originating from the magnetic north pole 20 and south pole 22, respectively, and changing their initial profile due to the closely spaced vehicular lid 14. These two magnetic field lines 16', 16" make clear in illustrative manner the importance of changing the magnetic flux density and the way how the local minimum of the magnetic flux density is produced in the area of the sensor 18. A magnetic field line 16''' is shown as the last, still closed magnetic field line between the sensor 18 and the magnet 16.

Figure 4:
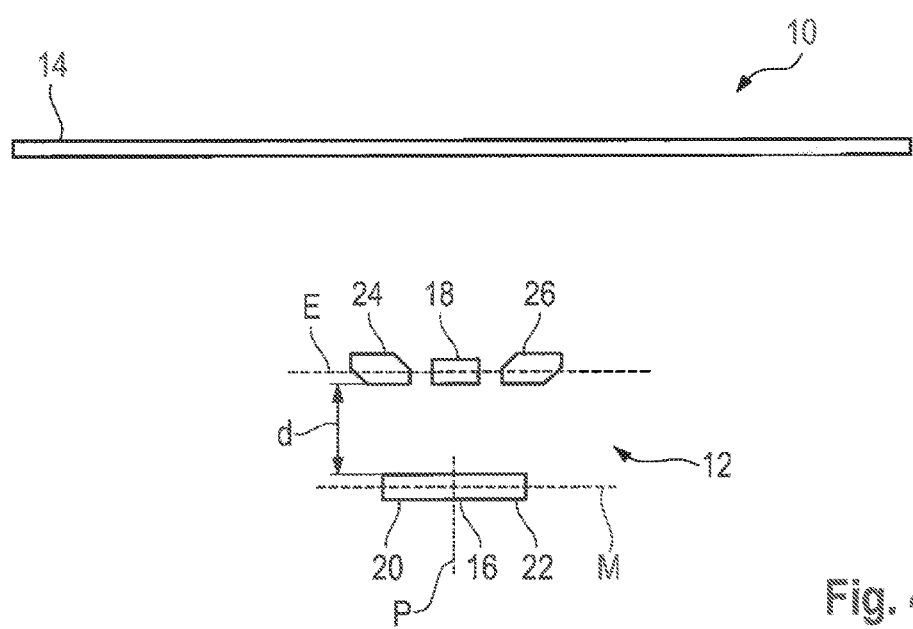
FIG. 4 is a schematic illustration of an assembly unit according to a second embodiment.

FIG. 4 shows a schematic view of the assembly unit 10 according to a second embodiment, differing from the first embodiment in that flux guiding elements 24, 26 are provided in addition. The flux guiding elements 24, 26 are arranged on the two sides of the sensor 18 and protrude beyond the sensor 18 with the side facing the vehicular lid 14, which means that the flux guiding elements 24, 26 are designed so as to have an increased thickness.

In general, the flux guiding elements 24, 26 have an influence on the magnetic flux density. The operational principle of the flux guiding elements 24, 26 is illustrated on the basis of FIGS. 5 and 6, showing the assembly unit 10 of FIG. 4 in the first or non-switched state (FIG. 5) and in the second or switched state (FIG. 6).

Figure 5:
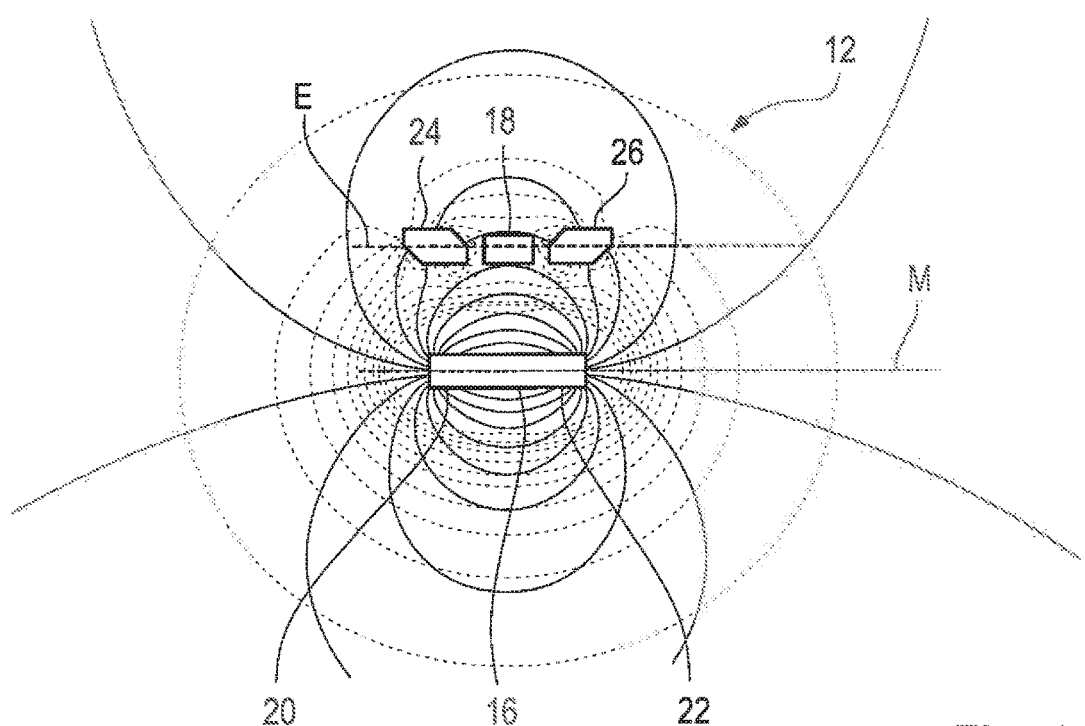
FIG. 5 shows the magnetic flux density of the assembly unit according to the second embodiment in the first state.
Figure 6:
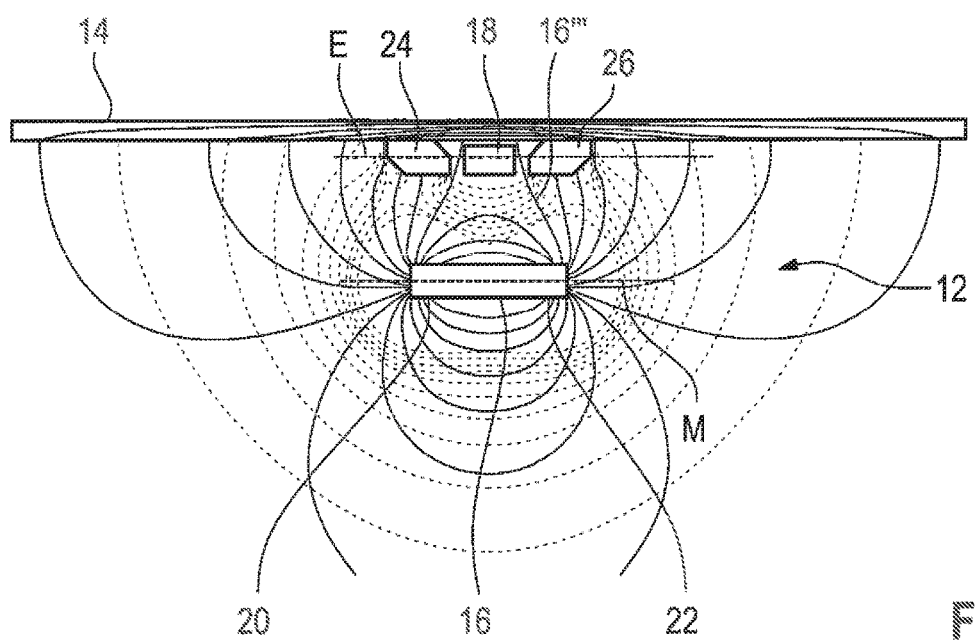
FIG. 6 shows the magnetic flux density of the assembly unit according to the second embodiment in the second state.

It is apparent from FIG. 5 that the flux guiding elements 24, 26 enhance the magnetic flux density in the area of the sensor 18 due to the positioning and the geometry of the flux guiding elements 24, 26. This is due to the fact that the flux guiding elements 24, 26 are made of a material which conducts the magnetic flux, the magnetic field lines entering and leaving the flux guiding elements 24, 26 in substantially perpendicular direction. This results in a concentration of the magnetic flux density in the area of the sensor 18, if the proximity sensor 12 is in the first state, which means that there is no element to be monitored in the area of the sensor 18, such as a vehicular lid 14.

The enhancement of the magnetic flux density is demonstrated inter alia by the fact that the magnetic field is not symmetric with respect to the magnet axis M any longer. In the area of the sensor 18, the magnetic field is enhanced, as explained above, and the magnetic flux density is increased.

In the embodiment which is shown, the magnetic flux density is symmetric with regard to the pole parting plane P. However, this symmetry depends, among other things, on the relative positioning of the flux guiding elements 24, 26 with regard to the magnet 16.

FIG. 6 shows the second or switched state of the assembly unit 10, the vehicular lid 14 being in direct contact with the flux guiding elements 24, 26, so that the sensor 18 is in an area in which the magnetic flux density is broken down almost completely. This is due to the fact that the magnetic field lines are deflected by the flux guiding elements 24, 26 close to the sensor 18 in such a manner that they enter the vehicular lid 14 and create the magnetic short-circuit there.

A comparison of FIGS. 3 and 6 illustrates this circumstance on closer inspection. FIG. 3 shows four magnetic field lines in the area between the sensor 18 and the magnet 16, which have a closed course, whereas there are only three magnetic field lines in FIG. 6. This means that the last closed magnetic field line 16''' from FIG. 3 is the one magnetic field line in FIG. 6 which now is also deflected into the vehicular lid 14 and closes only there and hence contributes to the magnetic short-circuit.

The flux guiding elements 24, 26 hence represent enhancing elements for the assembly unit 10 and the proximity sensor 12, as they concentrate the magnetic flux density in the area of the sensor 18 in the first state and make the magnetic flux density break down almost completely in the second state, so that a local minimum is created.

Figure 7:
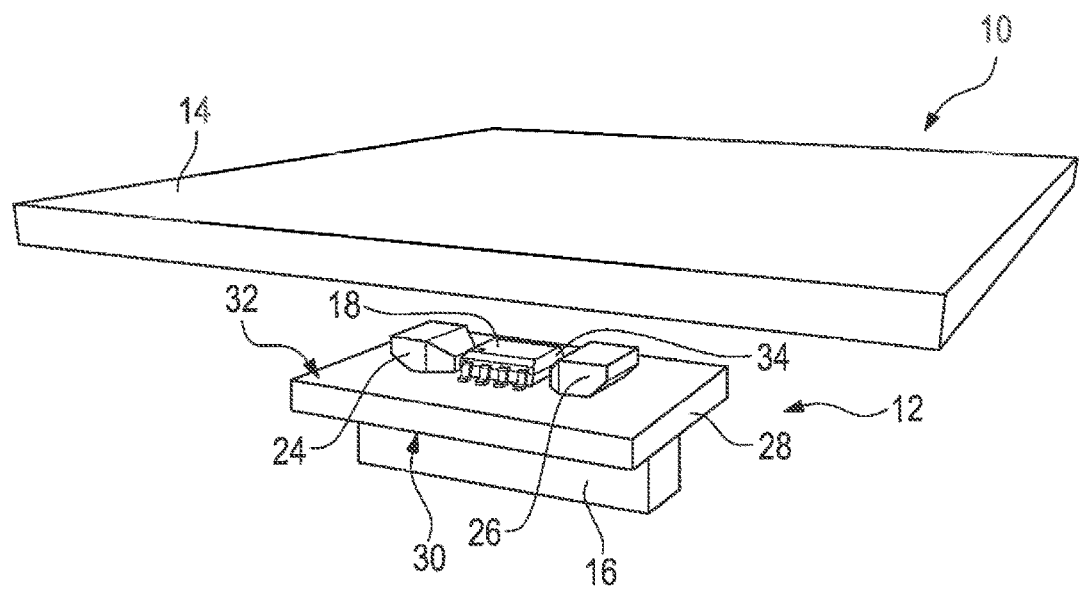
FIG. 7 is a perspective view of an assembly unit according to a third embodiment.
Figure 8:
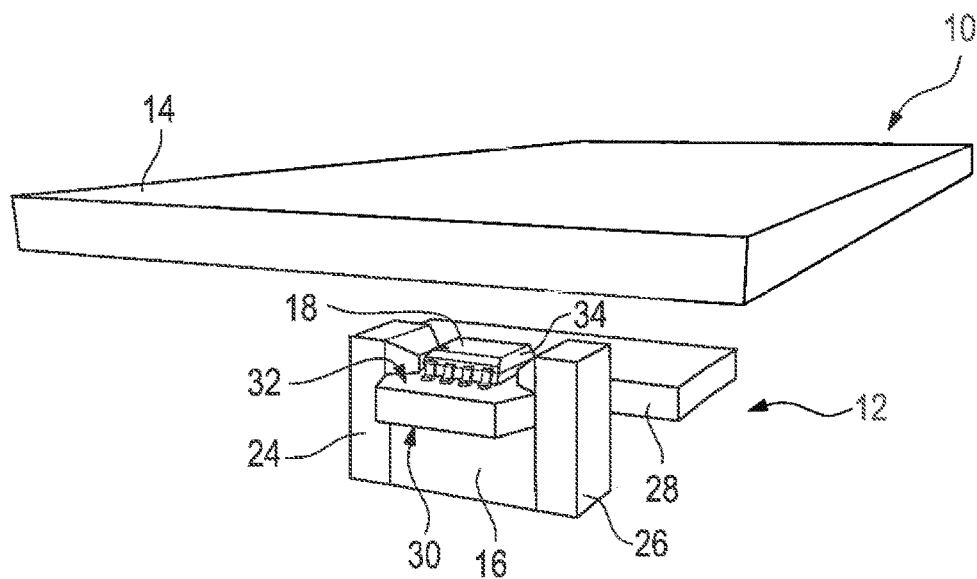
FIG. 8 is a perspective view of an assembly unit according to a further embodiment.

FIGS. 7 and 8 show two further embodiments of the assembly unit 10, which differ by the design of the proximity sensor 12. In the embodiment shown in FIG. 7, the proximity sensor 12 comprises a printed circuit board 28, comprising the magnet 16 on the one side 30 and the sensor 18 on the opposite side 32.

Formed on the printed circuit board 28 is a circuit 34 which has the sensor 18 integrated therein. Due to this arrangement, the circuit 34 comprising the integrated sensor 18 can be designed such that the proximity sensor 12 is formed as a switch. This allows to transmit any magnetic flux density alterations detected by the sensor 18 to a corresponding control unit (not shown here) processing the switching signal.

Similar to the preceding embodiments, the sensor 18 is further associated to the vehicular lid 14, the sensor 18 being laterally surrounded by two flux guiding elements 24, 26. The height of the flux guiding elements 24, 26 is designed such that they protrude beyond the sensor 18, so that the vehicular lid 14 can get in direct contact with the flux guiding elements 24, 26. This is particularly advantageous if the sensor 18 is surrounded by a housing, also referred to as a package, impeding that the vehicular lid 14 can be moved close to the actual sensor 18.

The embodiment of the assembly unit 10 shown in FIG. 8 differs from that one shown in FIG. 7 to the effect that the flux guiding elements 24, 26 extend through the printed circuit board 28, the flux guiding elements 24, 26 each resting against one of the poles 20, 22 of the magnet 16. This has the effect that the flux guiding elements 24, 26 are able to exert a magnetic force on the vehicular lid 14, allowing the vehicular lid 14 to be retained by the flux guiding elements 24, 26 in the holding position in the switched state. The magnetic holding forces originating from the magnet poles 20, 22 are transmitted via the flux guiding elements 24, 26 to the vehicular lid 14.

The sensor 18 may in particular be a GMR sensor or a Hall sensor. The two sensor types differ in particular by the structural height of the sensor 18 or their orientation of the housing. The direction E of maximum sensitivity, however, remains unchanged and is parallel to the magnet axis M. This means that when implementing the sensor 18 as a Hall sensor, it has a larger design height, so that the flux guiding elements 24, 26 have to be configured with a correspondingly larger height.

If the sensor 18 is implemented as a GMR sensor or Hall sensor, a memory as well as a processing unit are required. The memory holds a threshold value which is compared by means of the processing unit with the magnetic flux density detected by the sensor 18. If the flux density value exceeds or falls below the threshold value, a corresponding signal is activated, so that it is perceived whether there is the first state or the second state.

Alternatively, the sensor 18 may be implemented as a Reed sensor, performing the switching process by itself due to its configuration when a defined magnetic field intensity is reached. According to this, a sensor 18 of such design comprises a construction-related threshold value memory, as depending on the configuration of the Reed sensor, the latter changes with a specific magnetic field intensity to its switched or non-switched state, i.e. second or first state.

The invention claimed is:

1. A proximity sensor (12) comprising a magnet (16), a sensor (18), and flux guiding elements (24, 26), the proximity sensor (12) detects the approach of a part to be monitored (14), the sensor (18) being a magnetic field sensor that identifies a change in the magnetic field of the magnet (16) or a change of the magnetic flux density of the magnet (16), the sensor (18) being positioned stationary between the two poles (20, 22) of the magnet (16), and situated between the magnet (16) and the part to be monitored (14), the sensor (18) being aligned relative to the magnet (16) in such a manner that the direction (E) of maximum sensitivity of the sensor (18) is oriented so as to be substantially parallel to the magnet axis (M) extending through the poles (20, 22) of the magnet (16), the flux guiding elements (24, 26) being arranged on the sides of the sensor (18) so that at least a portion of each of the flux guiding elements (24, 26) is in parallel with the sensor in the direction (E) of maximum sensitivity of the sensor (18), the sensor (18) and magnet (16) being arranged stationary with respect to each other, the part to be monitored (14) being made of a ferromagnetic material, wherein the approach of the part to be monitored (14) made of the ferromagnetic material changes the magnetic field of the magnet (16) or the magnetic flux density of the magnet (16), and directs magnetic flux lines away from the sensor (18) and into the part to be monitored (14), which decreases the magnetic flux density in the area of the sensor (18) and causes a magnetic short-circuit to occur.

2. The proximity sensor (12) according to claim 1, wherein the magnet (16) is a permanent magnet.

3. The proximity sensor (12) according to claim 1, wherein the sensor (18) is a GMR sensor or a Hall sensor.

4. The proximity sensor (12) according to claim 1, wherein the flux guiding elements (24, 26) rest against the magnet (16) at the two poles (20, 22) of the magnet (16).

5. The proximity sensor (12) according to claim 1, wherein the sensor (18) is provided in an integrated circuit (34) comprising a printed circuit board (28).

6. The proximity sensor (12) according to claim 5, wherein the circuit (34) constitutes a switch.

7. The proximity sensor (12) according to claim 5, wherein the sensor (18) is arranged on a first side (32) of the printed circuit board (28) and the magnet (16) is arranged on a second side (30) of the printed circuit board (28).

8. The proximity sensor (12) according to claim 5, wherein flux guiding elements (24, 26) are provided on the printed circuit board (28) and on that side (32) of the printed circuit board (28) where the sensor (18) is arranged.

9. The proximity sensor (12) according to claim 5, wherein flux guiding elements (24, 26) are provided and extend through the printed circuit board (28).

10. An assembly unit (10) comprising a vehicular lid (14) and a proximity sensor (12) according to claim 1.

11. The proximity sensor (12) according to claim 1, wherein the part to be monitored (14) is magnet-free.

12. The proximity sensor (12) according to claim 1, wherein a space between the sensor (18) and the part to be monitored (14) is magnet-free.

13. A proximity sensor (12) comprising a magnet (16), a sensor (18), and flux guiding elements (24, 26), the proximity sensor (12) detects the approach of a part to be monitored (14), the sensor (18) being a magnetic field sensor that identifies a change in the magnetic field of the magnet (16) or a change of the magnetic flux density of the magnet (16), the sensor (18) being positioned stationary between the two poles (20, 22) of the magnet (16), and situated between the magnet (16) and the part to be monitored (14), the sensor (18) being aligned relative to the magnet (16) in such a manner that the direction (E) of maximum sensitivity of the sensor (18) is oriented so as to be substantially parallel to the magnet axis (M) extending through the poles (20, 22) of the magnet (16), the flux guiding elements (24, 26) being arranged on the sides of the sensor (18) so that at least a portion of each of the flux guiding elements (24, 26) is in parallel with the sensor in the direction (E) of maximum sensitivity of the sensor (18), the sensor (18) and magnet (16) being arranged stationary with respect to each other, wherein the part to be monitored (14) deflects magnetic flux lines of the magnet (16) away from the sensor (18) and into the part to be monitored (14), which decreases the magnetic flux density in the area of the sensor (18) and causes a magnetic short-circuit to occur, when the part to be monitored (14) approaches the magnet (16).

14. The proximity sensor (12) according to claim 13, wherein the flux guiding elements (24, 26) rest against the magnet (16) at the two poles (20, 22) of the magnet (16).

15. The proximity sensor (12) according to claim 13, wherein the sensor (18) is provided in an integrated circuit (34) comprising a printed circuit board (28).

16. The proximity sensor (12) according to claim 15, wherein flux guiding elements (24, 26) are provided and extend through the printed circuit board (28).

17. The proximity sensor (12) according to claim 15, wherein flux guiding elements (24, 26) are provided on the printed circuit board (28) and on that side (32) of the printed circuit board (28) where the sensor (18) is arranged.

18. The proximity sensor (12) according to claim 13, wherein the part to be monitored (14) is made of ferromagnetic material.

19. The proximity sensor (12) according to claim 13, wherein the part to be monitored (14) is magnet-free.

20. A proximity sensor (12) comprising a magnet (16), a sensor (18), and flux guiding elements (24, 26), the proximity sensor (12) detects the approach of a part to be monitored (14), the sensor (18) being a magnetic field sensor that identifies a change in the magnetic field of the magnet (16) or a change of the magnetic flux density of the magnet (16), the sensor (18) being positioned stationary between the two poles (20, 22) of the magnet (16), and situated between the magnet (16) and the part to be monitored (14), the sensor (18) being aligned relative to the magnet (16) in such a manner that the direction (E) of maximum sensitivity of the sensor (18) is oriented so as to be substantially parallel to the magnet axis (M) extending through the poles (20, 22) of the magnet (16), the sensor (18) and magnet (16) being arranged stationary with respect to each other, the flux guiding elements (24, 26) resting against the magnet (16) at the two poles (20, 22) of the magnet (16), the part to be monitored (14) being made of a ferromagnetic material, wherein the approach of the part to be monitored (14) made of the ferromagnetic material changes the magnetic field of the magnet (16) or the magnetic flux density of the magnet (16), and directs magnetic flux lines away from the sensor (18) and into the part to be monitored (14), which decreases the magnetic flux density in the area of the sensor (18) and causes a magnetic short-circuit to occur.

* * * * *